United States Patent
Maniscalco et al.

(10) Patent No.: US 10,903,116 B2
(45) Date of Patent: Jan. 26, 2021

(54) VOID-FREE METALLIC INTERCONNECT STRUCTURES WITH SELF-FORMED DIFFUSION BARRIER LAYERS

(71) Applicant: International Business Machines Corporation, Armonk, NY (US)

(72) Inventors: Joseph F. Maniscalco, Lake Katrine, NY (US); Koichi Motoyama, Clifton Park, NY (US); James J. Kelly, Schenectady, NY (US); Hosadurga Shobha, Niskayuna, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/564,518

(22) Filed: Sep. 9, 2019

(65) Prior Publication Data

US 2020/0020577 A1    Jan. 16, 2020

Related U.S. Application Data

(62) Division of application No. 16/031,059, filed on Jul. 10, 2018, now Pat. No. 10,529,622.

(51) Int. Cl.
*H01L 21/768* (2006.01)
*C25D 5/02* (2006.01)
(Continued)

(52) U.S. Cl.
CPC ........ *H01L 21/76883* (2013.01); *C25D 5/022* (2013.01); *H01L 21/2885* (2013.01);
(Continued)

(58) Field of Classification Search
CPC ......... H01L 21/76858; H01L 21/76873; H01L 21/76879; H01L 21/76868; C25D 5/022
See application file for complete search history.

(56) References Cited

U.S. PATENT DOCUMENTS

| 6,022,808 A | 2/2000 | Nogami et al. |
| 6,444,567 B1 | 9/2002 | Besser et al. |
| (Continued) | | |

OTHER PUBLICATIONS

R.A. Rao et al., "A Method for Barrier Seed Integration for ULSI Copper Metallization," ip.com, IPCOM000008807D, Jul. 15, 2002, 6 pages.

(Continued)

*Primary Examiner* — Daniel Luke
(74) *Attorney, Agent, or Firm* — James Nock; Ryan, Mason & Lewis, LLP

(57) ABSTRACT

Methods are provided for fabricating void-free metallic interconnect structures with self-formed diffusion barrier layers. A seed layer is deposited to line an etched opening in a dielectric layer. A metallic capping layer is selectively deposited on upper portions and upper sidewall surfaces of the seed layer which define an aperture into the etched opening. An electroplating process is performed to plate metallic material on exposed surfaces of the seed layer within the etched opening, which are not covered by the capping layer to form a metallic interconnect. The capping layer prohibits plating of metallic material on the capping layer and closing the aperture before the electroplating process is complete. A thermal anneal process is performed to cause the metallic material of the metallic capping layer to diffuse though the metallic interconnect and create a self-formed diffusion barrier layer between the metallic interconnect and the surfaces of the etched opening.

20 Claims, 11 Drawing Sheets

THERMAL ANNEAL

(51) Int. Cl.
  *H01L 21/311*   (2006.01)
  *H01L 21/321*   (2006.01)
  *H01L 23/522*   (2006.01)
  *H01L 21/3105*  (2006.01)
  *H01L 23/532*   (2006.01)
  *H01L 21/288*   (2006.01)

(52) U.S. Cl.
  CPC .. *H01L 21/31053* (2013.01); *H01L 21/31111* (2013.01); *H01L 21/3212* (2013.01); *H01L 21/7684* (2013.01); *H01L 21/76802* (2013.01); *H01L 21/76816* (2013.01); *H01L 21/76819* (2013.01); *H01L 21/76831* (2013.01); *H01L 21/76846* (2013.01); *H01L 21/76858* (2013.01); *H01L 21/76867* (2013.01); *H01L 21/76868* (2013.01); *H01L 21/76873* (2013.01); *H01L 21/76879* (2013.01); *H01L 21/76886* (2013.01); *H01L 23/5226* (2013.01); *H01L 23/53238* (2013.01)

(56) References Cited

U.S. PATENT DOCUMENTS

| | | | |
|---|---|---|---|
| 6,932,892 | B2 | 8/2005 | Chen et al. |
| 7,354,849 | B2 | 4/2008 | Plombon et al. |
| 7,714,440 | B2 | 5/2010 | Ryu et al. |
| 7,964,506 | B1 | 6/2011 | Ponnuswamy et al. |
| 9,087,881 | B2 | 7/2015 | Lin et al. |
| 9,869,029 | B2 | 1/2018 | Roeger-Goepfert et al. |
| 2003/0134510 | A1 | 7/2003 | Lee et al. |
| 2005/0142844 | A1 | 6/2005 | Ahn |
| 2007/0004192 | A1 | 1/2007 | Park et al. |
| 2008/0296768 | A1 | 12/2008 | Chebiam et al. |
| 2009/0148677 | A1 | 6/2009 | Edelstein et al. |
| 2010/0314766 | A1 | 12/2010 | Sekiguchi et al. |
| 2013/0214416 | A1 | 8/2013 | Edelstein et al. |
| 2018/0158781 | A1 | 6/2018 | Jung et al. |

OTHER PUBLICATIONS

Disclosed Anonymously, "RuMn Alloy CVD, ALD," ip.com, IPCOM000223304D, Nov. 15, 2012, 2 pages.
List of IBM Patents or Patent Applications Treated as Related.

VOID-FREE METALLIC INTERCONNECT STRUCTURES WITH SELF-FORMED DIFFUSION BARRIER LAYERS

TECHNICAL FIELD

This disclosure generally relates to semiconductor fabrication techniques and, in particular, techniques for fabricating metallic interconnect structures.

BACKGROUND

A semiconductor integrated circuit chip is typically fabricated with a back-end-of-line (BEOL) interconnect structure, which comprises multiple levels of metal lines and inter-level metal vias, to connect various integrated circuit components and devices that are fabricated as part of a front-end-of-line (FEOL) layer of the semiconductor integrated circuit chip. Current state of the art BEOL process technologies typically implement copper to form BEOL interconnects, as the use of copper material is known to significantly reduce resistance due in the BEOL interconnect structure, resulting in improved conduction and higher performance.

Conventional metallic interconnect structures utilize copper diffusion barrier layers (e.g., tantalum nitride (TaN)) to line exposed sidewall and bottom surfaces of openings (e.g., trench openings and via openings) that are patterned in an interlevel-dielectric (ILD) prior to filling the openings with copper material. The diffusion barrier layer prevents copper from diffusing into the dielectric material of the ILD layer and damaging the BEOL structure. However, as copper interconnects are scaled down to 7 nm and beyond, the use of diffusion barrier layers becomes problematic. As feature size decreases, the number of challenges in fabrication defect-free copper interconnects increases. For example, physical vapor deposition (PVD) typically provides non-uniform coverage along sidewalls of a trench or via. With trenches getting narrower, the PVD copper seed layer must be make thinner, in order to prevent pinch-off at the top of the trench, and allow enough volume for Copper plating. For certain feature sizes and aspect rations, this can result in incomplete Copper seed coverage.

For example, copper diffusion barrier layers must be made sufficiently thick to adequately prevent diffusion of copper atoms into the ILD layer. The required thickness of the copper diffusion barrier layer remains relatively constant as the line width of copper interconnects scales down. As such, the amount (volume) of the metal line which is composed of copper is reduced which, in turn, affects various line width-dependent characteristics such as grain structure and resistivity.

Moreover, since diffusion barrier layers are typically formed of a material (e.g., TaN) which does not sufficiently act as a wetting layer for electroplated copper, a thin seed layer is typically formed via PVD or chemical vapor deposition (CVD) on the diffusion barrier layer prior to the copper fill. The combined thickness of the diffusion barrier layer and the seed layer can adversely affect the copper filling ability due to a further narrowing of already narrow lines. For Copper interconnects of 7 nm and beyond, it is difficult to secure good enough coverage of barrier metal because of spatial limitations. It is also difficult to avoid the creation of top center voids caused by pinch-off during a copper electroplating process due to a small gap opening. Indeed, when conventional plating techniques are used to fill high aspect ratio vias or trenches, seams and voids develop within the electroplated metallization and these seams and voids inevitably affect contact performance.

SUMMARY

Embodiments of the invention include methods for fabricating void-free metallic interconnect structures with self-forming diffusion barrier layers, and semiconductor devices comprising void-free metallic interconnect structures with self-formed diffusion barrier layers.

For example, in one embodiment, a method for fabricating a metallic interconnect of a semiconductor device, comprises: etching an opening in a dielectric layer; forming a liner layer on sidewall and bottom surfaces of the etched opening in the dielectric layer; forming a seed layer over the liner layer; and depositing a metallic material to selectively form a metallic capping layer on an upper portion of the seed layer within a field region surrounding the etched opening and on upper sidewall surfaces of the seed layer which define an aperture into the etched opening. An electroplating process is performed to fill the etched opening with electroplated metallic material and form a metallic interconnect. The electroplating commences by plating the metallic material on exposed sidewall and bottom surfaces of the seed layer within the etched opening which are not covered by the metallic capping layer. The metallic capping layer prohibits electroplated metallic material from being plated onto a surface of the metallic capping layer during the electroplating process and closing the aperture before the electroplating process is complete. A thermal anneal process is then performed to cause at least some of the metallic material of the metallic capping layer to diffuse toward the liner layer and create a self-formed diffusion barrier layer.

In another embodiment, a method for fabricating a metallic interconnect of a semiconductor device, comprises: etching an opening in a dielectric layer; forming a liner layer on sidewall and bottom surfaces of the etched opening in the dielectric layer; forming a first seed layer over the liner layer; and depositing a metallic material to selectively form a metallic capping layer on (i) an upper portion of the seed layer within a field region surrounding the etched opening, (ii) upper sidewall surfaces of the seed layer which define an aperture into the etched opening, and on (iii) a bottom surface of the seed layer within the etched opening. A first electroplating process is performed to plate metallic material on exposed sidewall surfaces of the seed layer within the etched opening which are not covered by the metallic capping layer. The metallic capping layer prohibits electroplated metallic material from being plated onto a surface of the metallic capping layer during the first electroplating process and decreasing a size of the aperture. A second seed layer is formed over the metallic capping layer and the plated metallic material on the sidewall surface of the seed layer, subsequent to the first electroplating process. A second electroplating process is then performed to fill the etched opening with electroplated metallic material and form a metallic interconnect, wherein the electroplating commences by plating the metallic material on the second seed layer. A thermal anneal process is then performed to cause at least some of the metallic material of the metallic capping layer to diffuse toward the liner layer and create a self-formed diffusion barrier layer.

Other embodiments will be described in the following detailed description of embodiments, which is to be read in conjunction with the accompanying figures.

BRIEF DESCRIPTION OF THE DRAWINGS

FIGS. 1-9 schematically illustrate a method for fabricating void-free metallic interconnect structures with self-forming diffusion barrier layers, according to an embodiment of the invention, wherein:

FIG. 1 is a schematic cross-sectional side view of a semiconductor device at an intermediate stage of fabrication comprising a semiconductor substrate a front-end-of-line/ middle-of-line structure formed on the semiconductor substrate, a metallic capping layer, a dielectric layer, and an etched opening in the dielectric layer;

FIG. 2 is a schematic cross-sectional side view of the semiconductor device of FIG. 1 after forming a thin liner layer and a seed layer over the surface of the semiconductor device to line the sidewall and bottom surfaces of the etched opening;

FIG. 3 is a schematic cross-sectional side view of the semiconductor device of FIG. 2 after selectively depositing a metallic capping layer on upper portions of the seed layer;

FIG. 4 schematically illustrates an electroplating process which is performed on the semiconductor device of FIG. 3 to fill the etched opening with electroplated metallic material;

FIG. 5 is a schematic cross-sectional side view of the resulting semiconductor device of FIG. 4 after depositing a copper seed layer over the metallic capping layer;

FIG. 6 is a schematic cross-sectional side view of the semiconductor device of FIG. 5 after performing a second electroplating process to deposit a layer of electroplated metallic material on the seed layer to form a relatively planar surface for chemical mechanical polishing;

FIG. 7 schematically illustrates a thermal anneal process which is performed to create a self-formed diffusion barrier layer using material of the metallic capping layer;

FIG. 8 schematically illustrates a chemical-mechanical polishing process which is performed to remove the overburden material and form a metallic interconnect structure; and FIG. 9 schematically illustrates a second thermal anneal process which is performed on the semiconductor device of FIG. 8 to remove residual material of the metallic capping layer within an upper region of the metallic interconnect structure.

FIGS. 10-16 schematically illustrate a method for fabricating void-free metallic interconnect structures with self-forming diffusion barrier layers, according to another embodiment of the invention, wherein:

FIG. 10 is a schematic cross-sectional side view of a semiconductor device at an intermediate stage of fabrication comprising a dielectric layer having an etched opening, a liner layer, a seed layer with overhangs, and a metallic capping layer;

FIG. 11 is a schematic cross-sectional side view of a semiconductor device of FIG. 10 after performing an initial electroplating process to deposit electroplated metallic material on exposed sidewalls of the seed layer within the etched opening, which are not covered by the metallic capping layer;

FIG. 12 is a schematic cross-sectional side view of the semiconductor device of FIG. 11 after depositing a thin copper seed layer to cover the metallic capping layer and the initial electroplated metallic material;

FIG. 13 is a schematic cross-sectional side view of the semiconductor device of FIG. 12 after performing a second electroplating process to deposit a layer of electroplated metallic material to fill the etched opening with the electroplated metallic material;

FIG. 14 schematically illustrates a thermal anneal process for creating a self-formed diffusion barrier layer using material of the metallic capping layer;

FIG. 15 is a schematic cross-sectional side view of the semiconductor device of FIG. 14 after performing a chemical-mechanical polishing process to planarize a surface of the semiconductor down to the dielectric layer; and FIG. 16 schematically illustrates a thermal anneal process which is performed on the semiconductor device of FIG. 15 to remove residual material of the metallic capping layer within the upper and lower regions of the metallic interconnect structure.

DETAILED DESCRIPTION

Embodiments will now be described in further detail with regard to methods for fabricating void-free metallic interconnect structures with self-formed diffusion barrier layers, and semiconductor devices comprising low-resistivity, void-free metallic interconnect structures with self-formed diffusion barrier layers. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
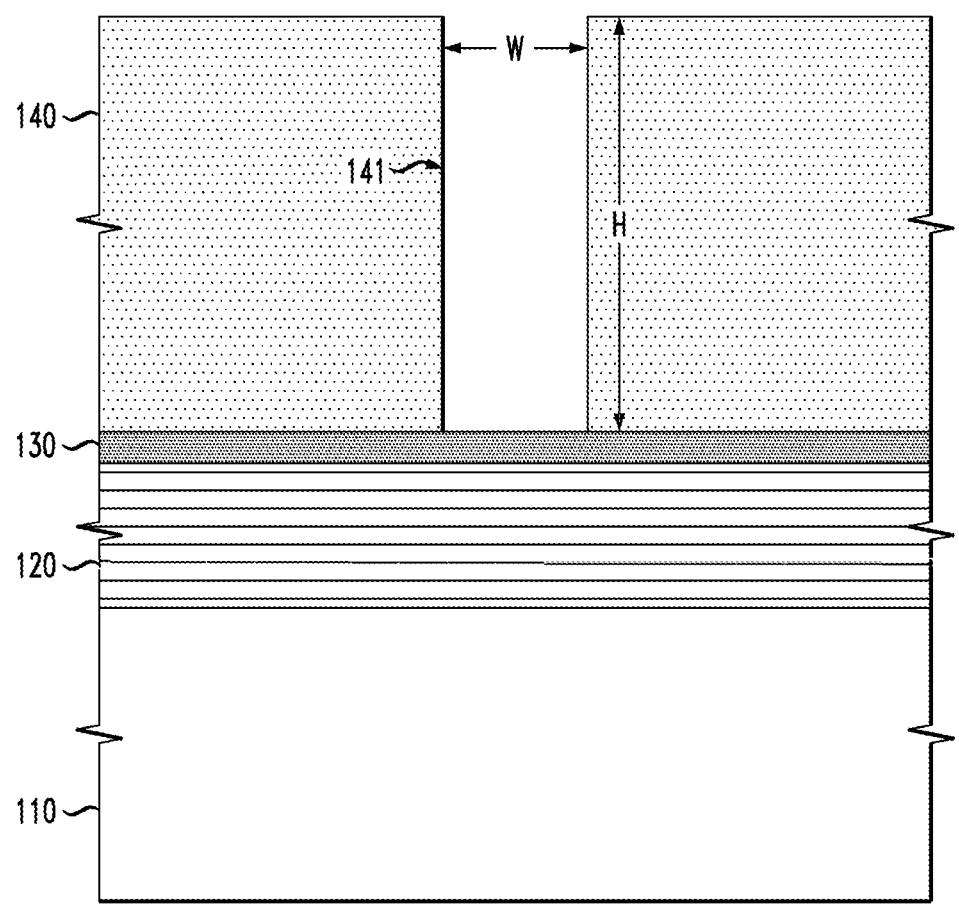

FIGS. 1-9 schematically illustrate a method for fabricating void-free metallic interconnect structures with self-forming diffusion barrier layers, according to an embodiment of the invention. To begin, FIG. 1 is a schematic cross-sectional side view of a semiconductor device 100 at an intermediate stage of fabrication comprising a semiconductor substrate 110 (e.g., semiconductor wafer), a FEOL (front-end-of-line)/MOL (middle-of-line) structure 120 formed on the semiconductor substrate 110, a capping layer 130, and a dielectric layer 140. While the semiconductor substrate 110 is illustrated as a generic substrate layer, it is to be understood that the semiconductor substrate 110 may comprise one of different types of semiconductor substrate structures and materials.

For example, in one embodiment, the semiconductor substrate 110 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 110 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of the FEOL. It is to be noted that in each drawing, the X-Y plane represents a plane that is parallel to the plane of the semiconductor substrate 110 (e.g., wafer) being processed.

The FEOL/MOL structure 120 comprises a FEOL layer formed on the semiconductor substrate 110. The FEOL layer comprises various semiconductor devices and components that are formed in or on the active surface of the semiconductor substrate 110 to provide integrated circuitry for a target application. For example, the FEOL layer comprises field-effect transistor (FET) devices (such as FinFET devices, vertical FET devices, planar FET device, etc.), bipolar transistors, diodes, capacitors, inductors, resistors, isolation devices, etc., which are formed in or on the active surface of the semiconductor substrate 110. In general, FEOL processes typically include preparing the semiconductor substrate 110 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 120 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure that is formed on the FEOL/MOL structure 120.

In the example process flow illustrated in FIG. 1, the capping layer 130 and dielectric layer 140 are formed as part of an initial phase of a BEOL process module to form a first metallization level of a BEOL interconnect structure. The capping layer 130 comprises a layer of insulating/dielectric material such as silicon nitride (SiN), silicon carbide (SiC), silicon carbon nitride (SiCN), hydrogenated silicon carbide (SiCH), or a multilayer stack comprising the same or different types of dielectric materials, etc., or other suitable low-k dielectric materials which are non-reactive with the metallic material that is used to form metallic interconnect structures in the BEOL. In one example embodiment, the capping layer 130 is formed with a thickness in a range of about 2 nm to about 60 nm.

The dielectric layer 140 is formed of any suitable dielectric material that is commonly utilized as an interlevel-dielectric (ILD) layer for BEOL process technologies. For example, the dielectric layer 140 can be formed of a dielectric material including, but not limited to, silicon oxide ($SiO_2$), silicon nitride (e.g., ($Si_3N_4$), hydrogenated silicon carbon oxide (SiCOH), SiCH, SiCNH, or other types of silicon-based low-k dielectrics (e.g., k less than about 4.0), porous dielectrics, or known ULK (ultra-low-k) dielectric materials (with k less than about 2.5). The thickness of the dielectric layer 140 defines a vertical height (or thickness) of the metallization that is formed within the dielectric layer 140, which will vary depending on the application. For example, in one embodiment, the dielectric layer 140 is formed with a thickness in a range of about 20 nm to about 800 nm. The capping layer 130 and the dielectric layer 140 are formed using known deposition techniques, such as, for example, ALD (atomic layer deposition), CVD, PECVD (plasma-enhanced CVD), or PVD, or spin-on deposition.

As further shown in FIG. 1, the dielectric layer 140 is patterned to form an opening 141 (e.g., trench opening or via opening) in the dielectric layer 140. The opening 141 comprises a width W in a range of about 10 nm to about 30 nm, and a height H in a range of about 30 nm to about 100 nm, which is defined by the thickness of the dielectric layer 140. The opening 141 comprises an aspect ratio (H:W) of about 3:1 or greater.

For illustrative purposes, FIG. 1 shows the use of a single damascene process in which metallic interconnect structures, e.g., metallic lines (wiring) and metallic vias (vertical interconnects) are separately formed in different insulating layers of a BEOL structure. In other embodiments, openings can be etched in the sacrificial dielectric layer 140 and filled with metallic material using one of various "dual" damascene patterning techniques known in the art in which trenches and via openings are patterned in the same dielectric layer and concurrently filled with metallic material. The dual damascene patterning methods include a "via first" process, a "trench first" process, and a "buried via" process, each of which comprising different sequences for etching the dielectric layer 140 to pattern the via openings and trench openings, while concurrently filling the via openings and trench openings with metallic material.

The damascene patterning of the sacrificial dielectric layer 140 can be implemented using any conventional photolithography and etching process, e.g., forming a photoresist mask on the upper surface of the sacrificial dielectric layer 140 which comprises an image of the opening 141 to be etched into the dielectric layer 140, followed by etching the dielectric layer 140 using a dry etch process such as RIE (reactive ion etching), which has an etch chemistry that is suitable to etch the dielectric layer 140 selective to the underlying capping layer 130 (which serves as an etch stop layer). The capping layer 130 insulates the metallization from the underlying PMD layer of the FEOL/MOL layer 120. However, in target locations where the metallization formed in the opening 141 will make contact to vertical contacts formed in the underlying FEOL/MOL layer 120, the capping layer 130 can be patterned by etching openings through the capping layer 130 at the bottom of the opening 141 at such target locations.

Figure 2:
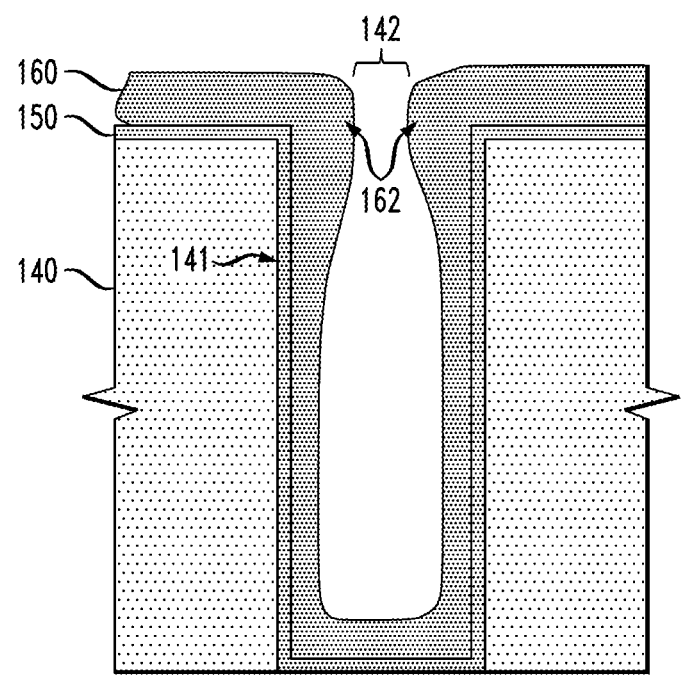

Next, FIG. 2 is a schematic cross-sectional side view of the semiconductor device of FIG. 1 after forming a thin liner layer 150 and a seed layer 160 over the surface of the semiconductor device to line the sidewall and bottom surfaces of the etched opening 141. In one embodiment, the liner layer 150 comprises a thin diffusion barrier layer which is conformally deposited on the exposed surfaces of the dielectric layer 140. In another embodiment, the liner layer 150 comprises a thin adhesion layer which is conformally deposited on the diffusion barrier layer. In yet another embodiment, the liner layer 150 is formed of a material which serves as both a diffusion barrier layer and an adhesion layer.

The diffusion barrier layer prohibits diffusion of metallic material (e.g., copper) of a metallic interconnect structure formed in the opening 141 into the surrounding material of the dielectric layer 140, as well as preventing out diffusion of oxygen from the dielectric layer 140 which would oxidize the metallic interconnect structure. A diffusion barrier layer for preventing copper diffusion can be a thin conformal layer titanium (Ti), titanium nitride (TiN), tantalum (Ta), tantalum nitride (TaN), tungsten (W), tungsten nitride (WN), or any other material that is suitable for use as a diffusion barrier to prohibit out diffusion of the metallic material (e.g., copper). The optional adhesion layer serves as a wetting layer to promote adhesion of the copper-plating seed layer 160 to the diffusion barrier layer. For example, an adhesion layer can be formed of cobalt (Co), Ta, ruthenium (Ru), a Ta—Ru alloy or any other suitable metal or metal alloy that is suitable for use as an adhesion layer to promote adhesion of the copper-plating seed layer 150 the diffusion barrier layer. A liner layer 150 formed of a ruthenium/tantalum alloy can serve as both a diffusion barrier and adhesion layer. The liner layer 150 is formed using PVD, CVD, ALD, depending on the thickness and level of conformality needed for the given application.

The seed layer 160 is deposited over the liner layer 150 to serve as a plating electrode and as a seed layer (or nucleation layer) for the metallic material (e.g., copper or copper alloy) to be filled into the remaining portion of the opening 141 by electrochemical deposition (ECD), or "electroplating." In one embodiment, the seed layer 160 comprises a metallic material which serves to promote selective electroplating of copper or a copper alloy on the seed layer 160 to fill the opening 141 with the copper or copper alloy material and form a metallic interconnect structure within the opening 141. For a copper electroplating process, the copper-plating seed layer 160 can be formed of copper, or a copper-ruthenium alloy, a copper-manganese alloy, iridium, an iridium alloy, ruthenium, a ruthenium alloy any other suitable noble metal or noble metal alloy which would selectively promote electroplating of copper or a copper alloy on the seed layer 160. The seed layer 160 can be deposited using PVD, CVD, or ALD, for example.

Typically, the seed layer 160 is formed by PVD sputtering of copper material. The copper seed layer 160 must be formed with a sufficient thickness to provide a continuous layer that can serve as a plating electrode (i.e., continuous conduction path for the electroplating process), as well as a void-free nucleating layer on the sidewalls of the opening 141 for the copper electroplating fill process. For example, a thin seed layer can result in the seed copper diffusing into globules leaving sidewall voids between the globules and, thus, forming a discontinuous seed layer on the sidewalls of the opening 141.

As shown in FIG. 2, PVD sputtering of a copper seed layer 160 (with sufficient thickness and continuous coverage) will typically result in the formation of overhangs 162 on the upper portions of the sidewalls of the opening 141. The overhangs 162 form a restricted aperture 142, which is narrower than the remaining size of the opening 141 after forming the seed layer 160. The overhangs 162 effectively increase the aspect ratio of the opening 141 making sidewall coverage of the copper seed layer even more difficult. Even if the formation of the overhangs 162 does not result in "pinch off" of the opening 141 during the copper seed deposition process (i.e. merging of the overhangs 162 and closing the opening 141), the overhangs 162 of the seed layer 160 can result in "pinch-off" during the subsequent copper plating process.

In particular, as copper material is deposited on the overhangs 162 during the electroplating copper fill process, the restricted aperture 142 decreases in size until the plated copper material on the overhangs 162 merge (i.e., pinch-off"). At this point, if the pinch-off occurs before the lower region of the opening 141 is filled, the pinch-off can result in the formation of unwanted seams and/or voids within the copper plating material which forms the metallic interconnect in the opening 141. To prevent pinch-off during the electroplating copper fill process, a metallic capping layer is formed on the overhangs 162 to prevent electroplated copper material from being deposited on the overhangs 162 and decreasing the size of the aperture 142.

Figure 3:
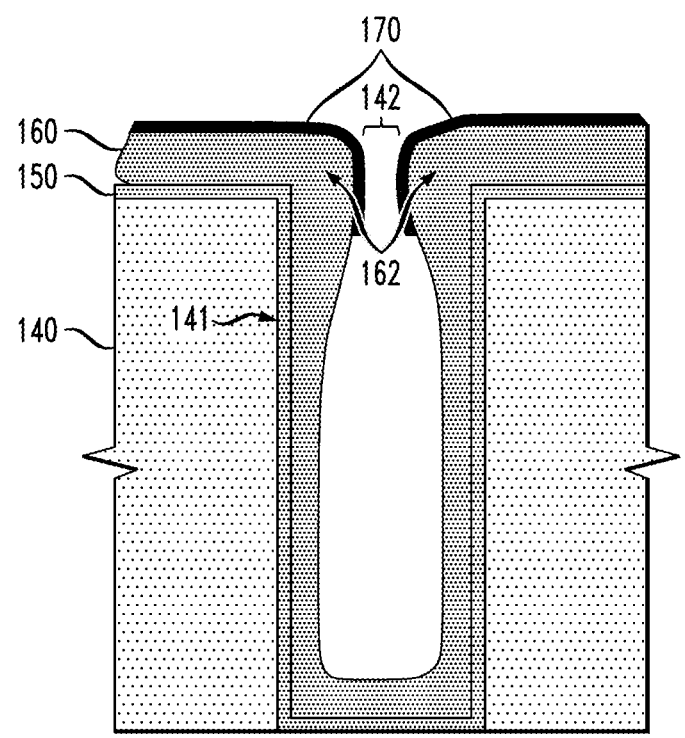

For example, FIG. 3 is a schematic cross-sectional side view of the semiconductor device of FIG. 2 after selectively depositing a metallic capping layer 170 on upper portions of the seed layer 160. In particular, as shown in FIG. 3, the metallic capping layer 170 is selectively deposited on the seed layer 160 to cover portions of the seed layer 160 in the lateral field region (surrounding the etched opening 141) and to cover the overhangs 162 of the seed layer 160. The metallic capping layer 170 covers the sidewalls of the overhangs 162 to prevent further restriction of the aperture 142 during the subsequent electroplating process. The metallic capping layer 170 comprises a thin layer of metallic material which is selectively deposited using a physical vapor deposition process (e.g., Ionized PVD) with very low wafer bias so that the metallic capping layer 170 is only formed on the regions of the seed layer 160 as shown in FIG. 3, and not on the sidewalls and bottom surface of the seed layer 160 within the etched opening 141. The low biasing of the wafer substrate minimizes the energy of the plasma ions, and thus achieves the desired selective deposition.

In one embodiment, the metallic capping layer 170 is formed of a metallic material that has a relatively high copper-plating over-potential which is sufficient to selectively prevent electroplating of copper material or the copper alloy on the metallic capping layer 170. For example, the metallic capping layer 170 can be formed of a metallic material such as tantalum, titanium, aluminum, manganese, ruthenium, etc. or any other suitable metal or metal alloy with a high copper-plating over-potential. The metallic capping layer 170 can be formed with a thickness in a range of about 1 nm to about 5 nm. Those of ordinary skill in the art will recognize that over-potential refers to energy required to force an electrode reaction to proceed. For example, in a copper or copper alloy electroplating process, the copper-plating over-potential refers to the energy required to force the copper or copper alloy to plate onto the cathode. A high over-potential limits plating, whereas a low over-potential enhances plating.

Moreover, the metallic capping layer 170 serves an additional purpose of providing a source of metallic material which is utilized to create a self-formed diffusion barrier layer. As discussed in further detail below, during a thermal annealing process implemented at a later stage of the fabrication process, some or all the metallic material of the metallic capping layer 170 will diffuse through the deposited copper material (electroplated copper, and copper seed layer, etc.) toward the liner layer 150 and create a self-formed barrier layer. In this regard, metallic materials such as tantalum, titanium, aluminum, manganese, ruthenium, etc., are sufficient to form the metallic capping layer 170 with the dual purpose of preventing copper electroplating on the metallic capping layer and providing a source of metallic material to form self-formed barrier layer.

Figure 4:
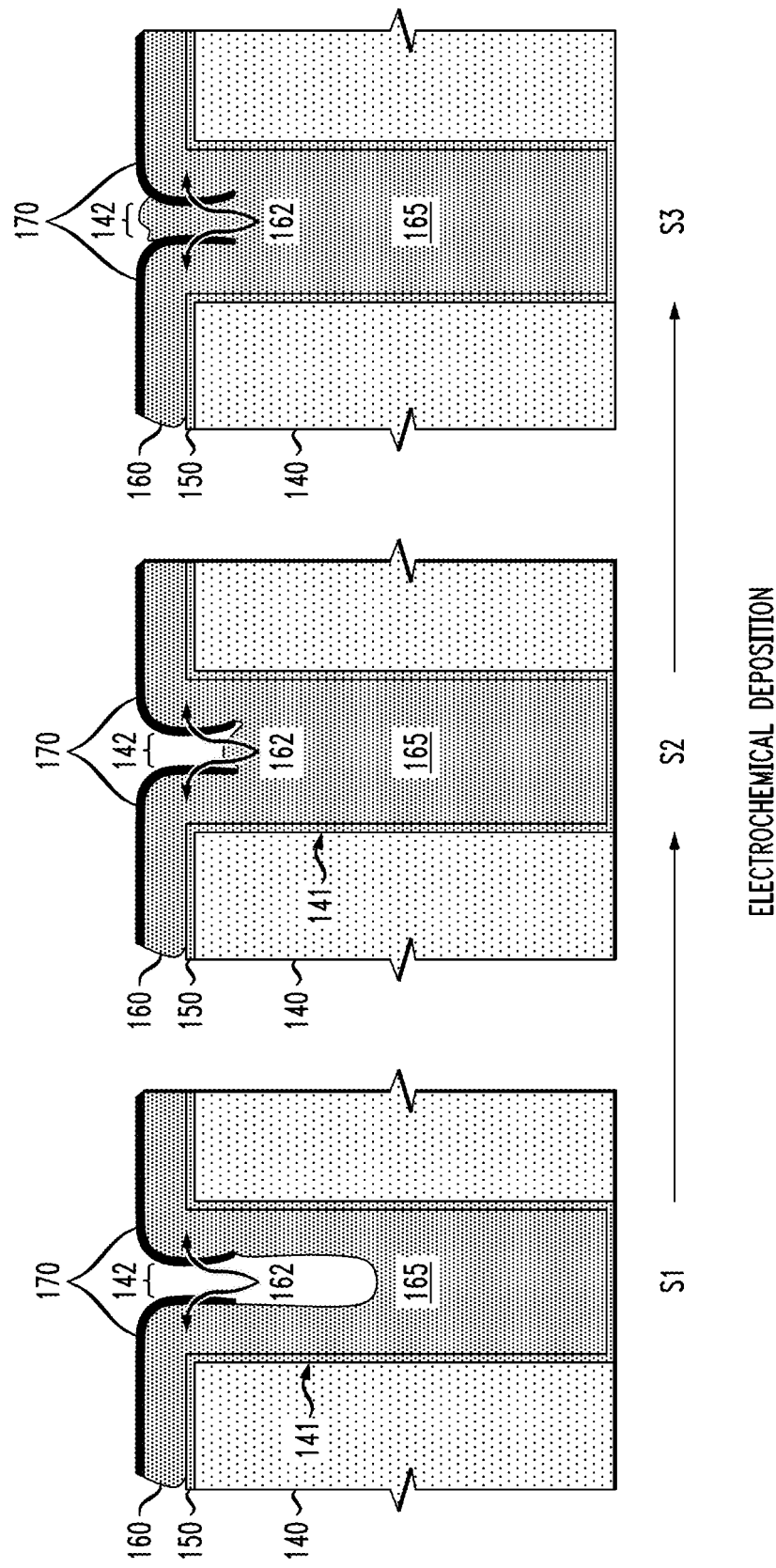

Next, FIG. 4 schematically illustrates a process for filling the etched opening 141 in the dielectric layer 140 with a metallic material 165 (e.g., copper) using an electroplating process (e.g., electrochemical deposition (ECD) copper plating process). In particular, FIG. 4 illustrates schematic cross-sectional side views of the semiconductor device of FIG. 3 at different stages S1, S2, and S3 of a copper electroplating process. The copper electroplating process commences with the semiconductor device of FIG. 3, wherein copper 165 is plated onto the exposed bottom and sidewall surfaces of the seed layer 160 within the etched opening 141. In this embodiment, the seed layer 160 serves as a cathode (electrode) for the copper plating process.

At stage S1 of the electroplating process shown in FIG. 4, the etched opening is partially filled with electroplated copper material 165, while no electroplated copper material is deposited on the surface of the metallic capping layer 170. At stage S2 of the electroplating process shown in FIG. 4, the etched opening 141 is filled with electroplated copper material 165 to a level just below the overhangs 162 of the seed layer 160, while no electroplated copper material is deposited on the surface of the metallic capping layer 170. During the electroplating process, the metallic capping layer 170 prevents further restriction of the aperture 142 so that the plating solution can readily flow into the remaining unfilled area of the etched opening 141 below the overhangs 162 to generate a void free copper fill. Following stage S2, the ECD process continues by bottom-up filling the aperture 142 with electroplated copper 165. At stage S3 of the electroplating process shown in FIG. 4, aperture 142 is filled with electroplated copper material 165, while no electroplated copper is deposed on the upper lateral surfaces of the metallic capping layer 170. Accordingly, during the ECD process illustrated in FIG. 4, the metallic capping layer 170 prevents "pinch-off" of the aperture 142 so that the electroplated copper material 165 which fills the etched opening 141 is free from seams and voids.

Figure 5:
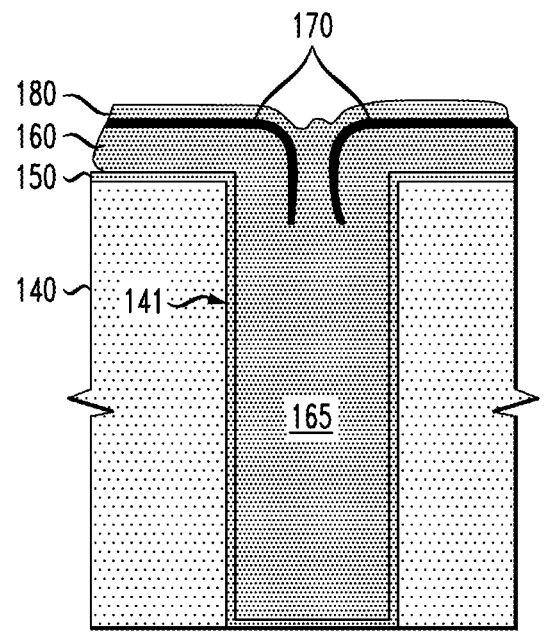
Figure 6:
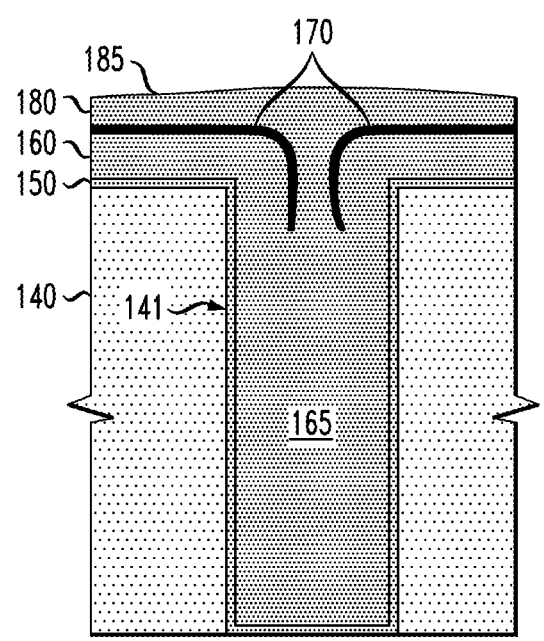

Following the initial ECD process of FIG. 4, an additional copper seed layer deposition and copper plating process is performed to obtain a sufficiently planarized overburden copper layer to facilitate a chemical-mechanical polishing (CMP) process. For example, FIG. 5 is a schematic cross-sectional side view of the semiconductor device shown in stage S3 of FIG. 4 after depositing a copper seed layer 180 over the metallic capping layer 170. The copper seed layer 180 can be deposited using PVD, CVD or ALD, for example. Next, FIG. 6 is a schematic cross-sectional side view of the semiconductor device of FIG. 5 after performing another electroplating process to deposit a layer of electroplated copper material 190 on the seed layer 180 to form a relatively planar surface for CMP.

Figure 7:
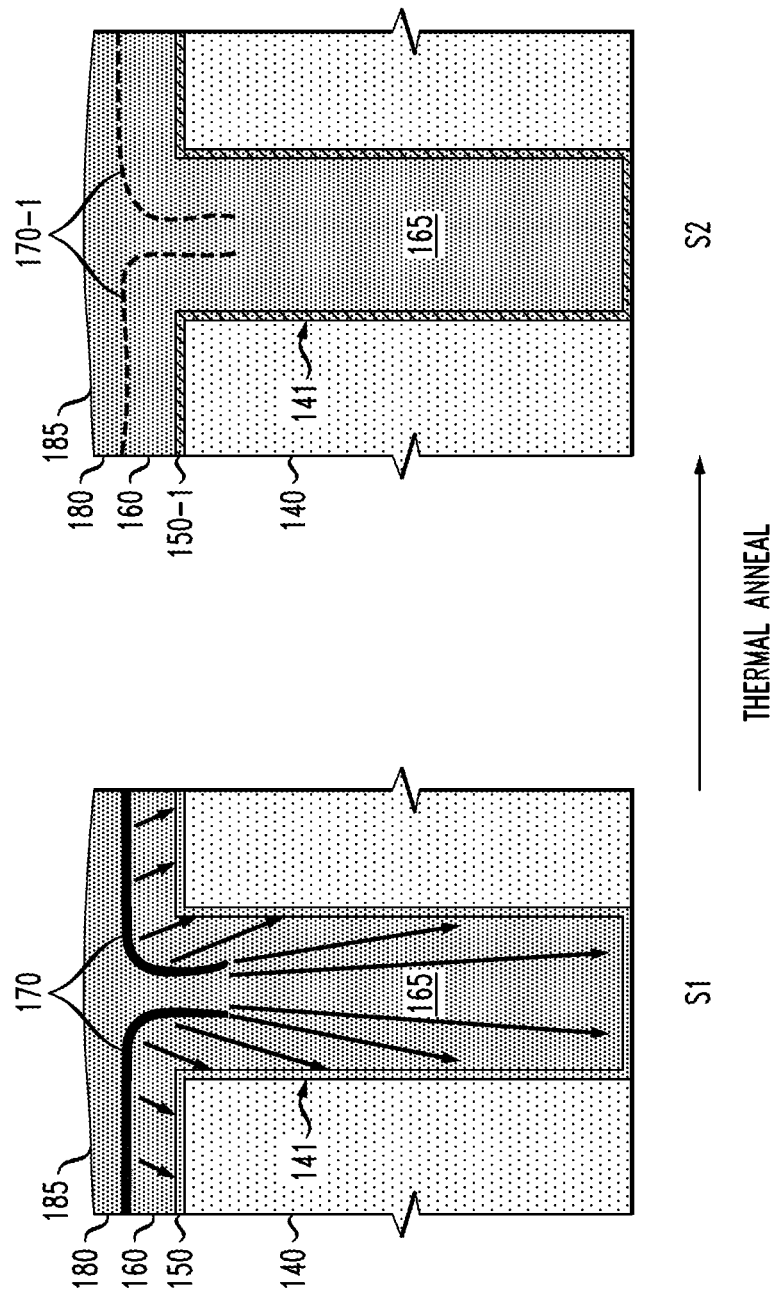

Next, FIG. 7 schematically illustrates a thermal anneal process for creating a self-formed diffusion barrier layer using the material of the metallic capping layer 170. In particular, FIG. 7 illustrates schematic cross-sectional side views of the semiconductor device of FIG. 6 at different stages S1 and S2 of a thermal anneal process which is performed to cause some or all the metallic material of the metallic capping layer 170 to diffuse through the electroplated copper material 165 and the seed layer 160 toward the liner layer 150 (as indicated by the arrows) and create a self-formed diffusion barrier layer 150-1. At a beginning stage S1 of the thermal anneal process shown in FIG. 7, the metallic atoms of the metallic capping layer 170 diffuse through the copper material towards the liner layer 150 on the sidewalls and bottom surface of the etched opening 141. In one embodiment, the thermal anneal process is performed in a furnace at a target temperature range and for a target period of time, which is sufficient to enable most or all the metallic atoms of the metallic capping layer 170 to diffuse towards the liner layer 150 and create the self-formed diffusion barrier layer 150-1.

At an ending stage S2 of the thermal anneal process shown in FIG. 7, a residual portion 170-1 (shown as dashed lines) of the initial metallic capping layer 170 may remain, while the self-formed diffusion barrier layer 150-1 is created from the metallic material of the metallic capping layer 170. The self-formed diffusion barrier layer 150-1 comprises a combination of the original liner layer 150 and the additional metallic material diffused from the metallic capping layer 170. In particular, in one embodiment, the additional metallic material diffused from the metallic capping layer 170 may self-form an additional thin barrier layer at the interface of the liner layer 150 and the copper seed layer 160, thereby effectively creating a new diffusion barrier layer 150-1 which is thicker than the original liner layer 150. In another embodiment, in instances where the original liner layer 150 is an extremely thin layer with discontinuities (e.g. voids), the additional metallic material diffused from the metallic capping layer 170 serves to fill in the voids in the original liner layer 150 and self-form a continuous and thicker barrier layer 150-1.

Figure 8:
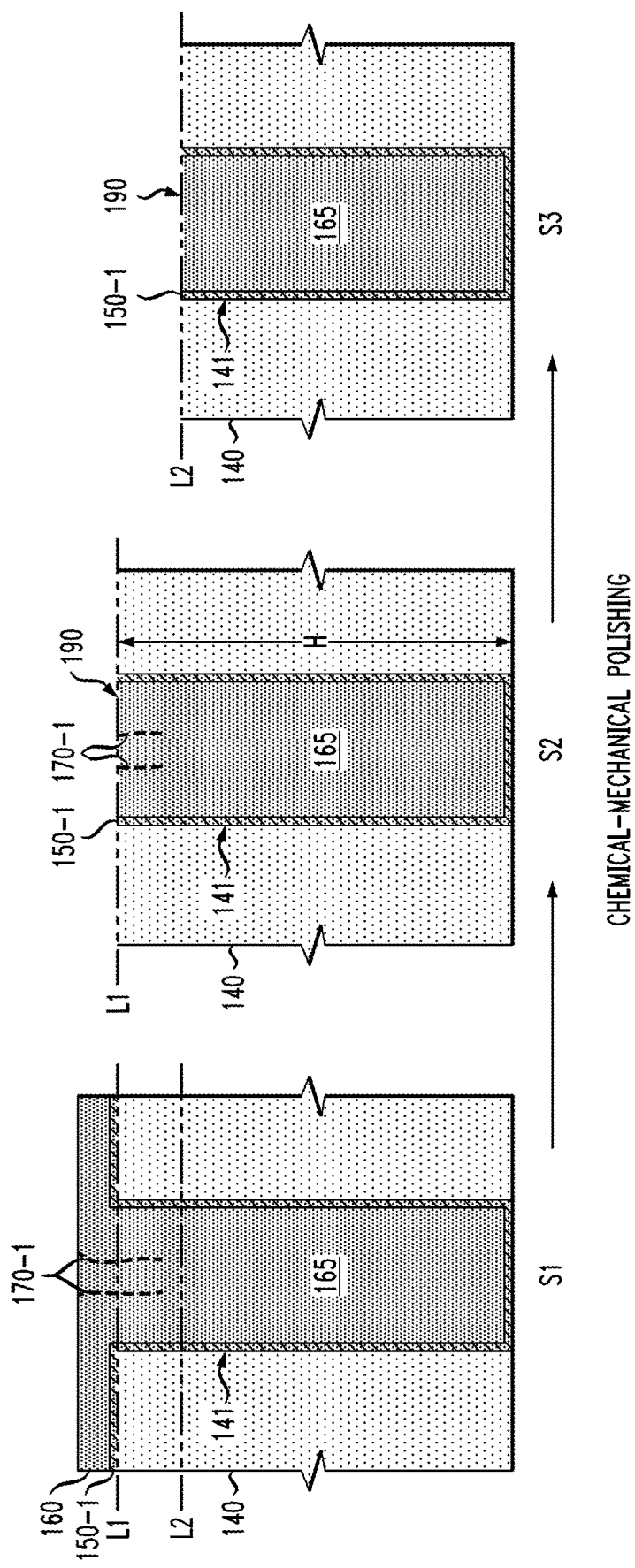

Following the thermal anneal process of FIG. 7, a CMP process is performed to planarize the surface of the semiconductor structure down to a target level to form a metallic interconnect stricture. For example, FIG. 8 illustrates schematic cross-sectional side views of the resulting semiconductor device of FIG. 7 at different stages S1, S2, and S3 of a CMP process which is performed to remove the overburden copper material and form a metallic interconnect structure 190. In particular, FIG. 8 schematically illustrates a beginning stage S1 of the CMP process showing a planarized surface in which the copper plating layer 185, the copper seed layer 180, and field portions of the residual metallic capping layer 170-1 have been etched away. FIG. 8 schematically illustrates a next stage S2 of the CMP process in which the surface of the semiconductor device has been planarized down to an upper surface (level L1) of the dielectric layer 140 to remove the overburden portions of the seed layer 160 and the self-formed barrier layer 150-1 in the field regions.

In one embodiment, the CMP process terminates at stage S2 with the planarized surface at level L1. In this instance, a metallic interconnect structure 190 is formed in the etched opening 141, wherein the metallic interconnect structure 190 comprises the self-formed barrier layer 150-1, and the plated copper material 165 (and portion of original seed layer 160), wherein a small portion of the residual metallic capping layer 170-1 remains within a top region of the copper material 165. The metallic interconnect 190 can be a via interconnect structure, or a metallic wire (which extends in a direction orthogonal to the plane of the drawing). With this embodiment, the small portion of the residual metallic capping layer 170-1 which remains within a top region of the copper material 165 can be left in place in instances wherein such small amount of the residual metallic capping layer 170-1 will not adversely affect performance of the metallic interconnect structure. On the other hand, in instances where the small amount of the residual metallic capping layer 170-1 may adversely affect performance of the metallic interconnect structure, the residual metallic capping layer 170-1 can be removed using various methods.

For example, in one embodiment, the CMP process can continue to a next stage S3 as shown in FIG. 8 in which the surface of the semiconductor device is planarized down to a lower level L2, which is sufficient to remove the residual metallic capping layer 170-1 within the upper region of the metallic interconnect structure 190. With this process, the original thickness (or height H) of the dielectric layer 140 is reduced, and the height of the metallic interconnect structure is reduced. In another embodiment, instead of continuing the CMP process to further recess the surface of the semiconductor down to the lower level L2, a second thermal anneal process can be performed following stage S2 of the CMP process of FIG. 8 to remove the residual metallic capping layer 170-1 within the upper region of the metallic interconnect structure 190 without a further CMP recess.

Figure 9:
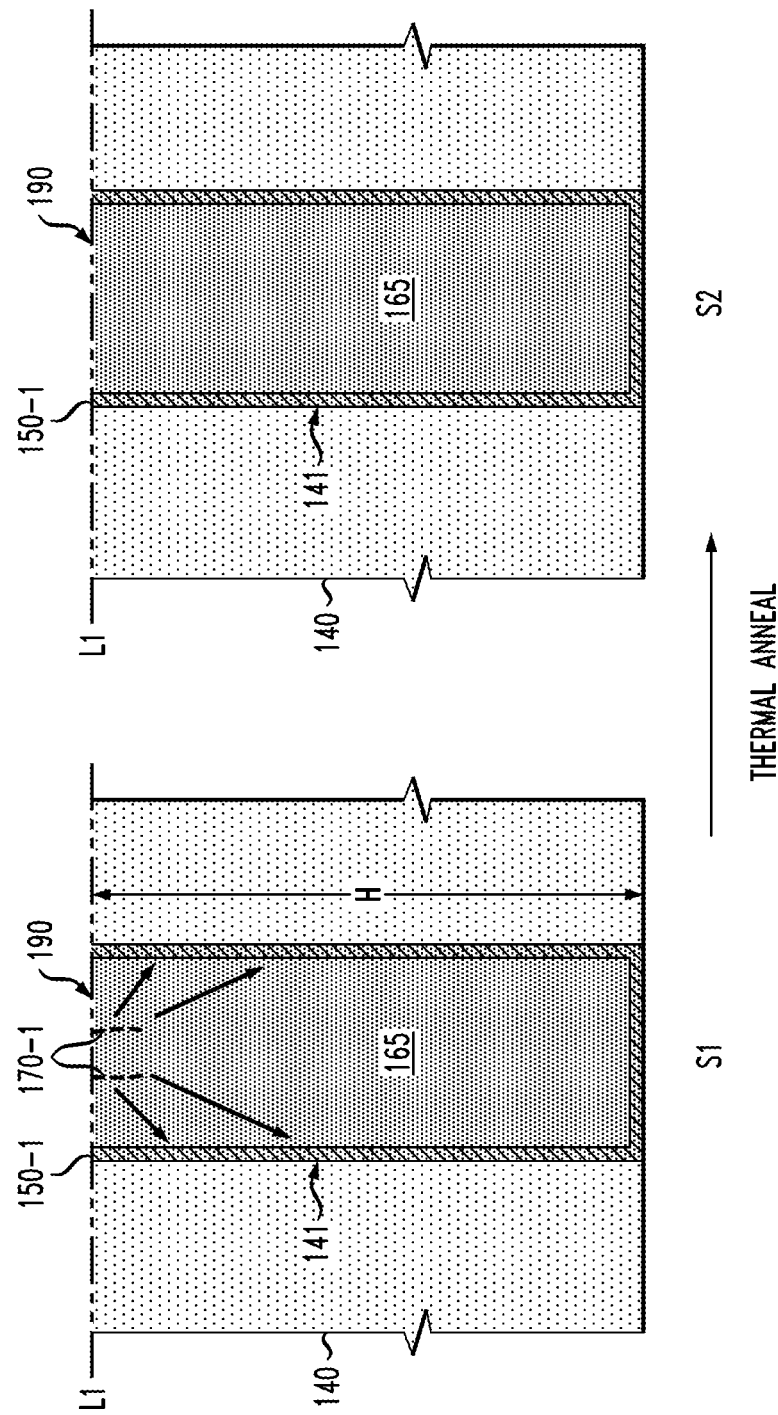

For example, FIG. 9 illustrates schematic cross-sectional side views of the semiconductor device at different stages S1 and S2 of a second thermal anneal process which is performed to remove the residual metallic capping layer 170-1 within the upper region of the metallic interconnect structure 190. At a beginning stage S1 of the second thermal anneal process shown in FIG. 9, the metallic atoms of the residual metallic capping layer 170-1 diffuse through the copper material 165 towards the self-formed barrier layer 150-1 (as schematically illustrated by arrows). In one embodiment, the thermal anneal process is performed in a furnace at a target temperature range and for a target period of time, which is sufficient to enable all (or substantially all) of the metallic atoms of the residual metallic capping layer 170-1 to diffuse towards and combine with the self-formed barrier 150-1, which further enhances the thickness and functionality of the self-formed diffusion barrier layer 150-1. At an ending stage S2 of the second thermal anneal process shown in FIG. 9, the copper material 165 no longer includes the residual metallic capping layer 170-1 within the upper region thereof. In this regard, the second thermal anneal process allows for removal of the residual metallic capping layer 170-1 without reducing the original height H of the dielectric layer 140 and thus the resulting interconnect structure 190.

Figure 10:
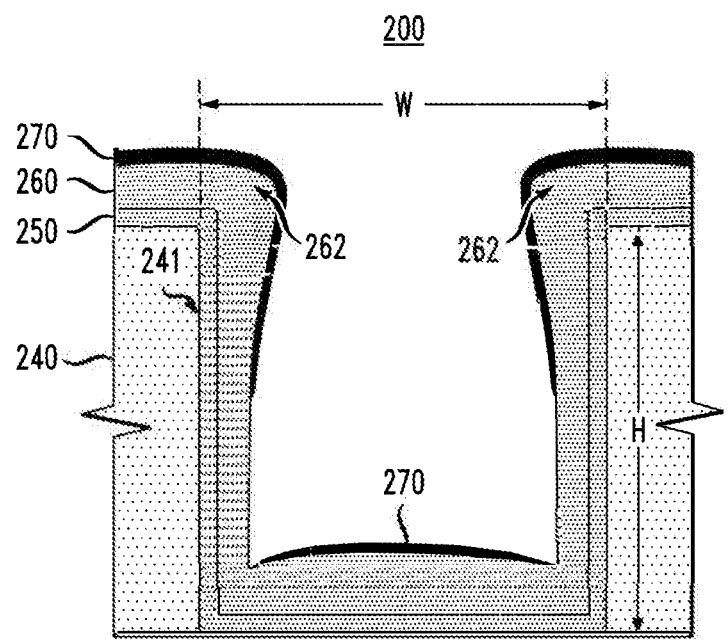

FIGS. 10-16 schematically illustrate a method for fabricating void-free metallic interconnect structures with self-forming diffusion barrier layers, according to another embodiment of the invention. In particular, FIGS. 10-16 schematically illustrate a method for fabricating a void-free metallic interconnect structure with a self-forming diffusion barrier layer, wherein the metallic interconnect structure is relatively wide with a lower aspect ratio, as compared to the narrower, higher aspect ratio metallic interconnect structure 190 discussed above. FIG. 10 is a schematic cross-sectional side view of a semiconductor device 200 at an intermediate stage of fabrication comprising a dielectric layer 240 having an etched opening 241, a liner layer 250, a seed layer 260 (with overhangs 262), and a metallic capping layer 270. The etched opening 241 has a width W in a range of about 30 nm to about 300 nm, and a height H in a range of about 30 nm to about 100 nm.

The dielectric layer 240, the liner layer 250, the seed layer 260, and the metallic capping layer 270 in FIG. 10 are formed of the same or similar materials and fabrication methods as the dielectric layer 140, the liner layer 150, the seed layer 160, and the metallic capping layer 170, as discussed above, the details of which will not be repeated. However, in comparison to the embodiment shown in FIG. 3, since the etched opening 241 in FIG. 10 is relatively wider than the etched opening 141 in FIG. 3, the metallic capping layer 270 is also selectively deposited on a bottom surface of the seed layer 260, as shown in FIG. 10.

Figure 11:
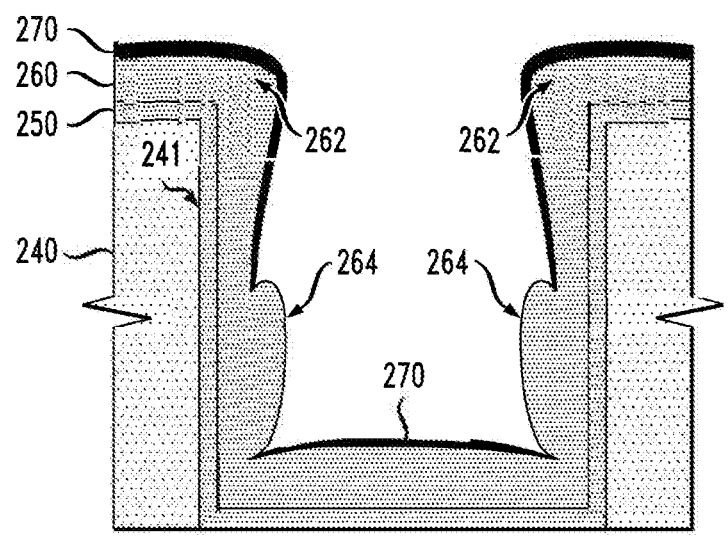

Next, FIG. 11 is a schematic cross-sectional side view of a semiconductor device of FIG. 10 after performing an initial electroplating process (e.g., ECD process) to deposit electroplated copper 264 on the exposedسidewalls of the seed layer 260 which are not covered by the metallic capping layer 270. The initial electroplating process is performed to build out copper material on the exposed sidewalls of the seed layer 260 to compensate for the protrusions of the overhangs 262 at the upper sidewalls of the etched opening 241.

Figure 12:
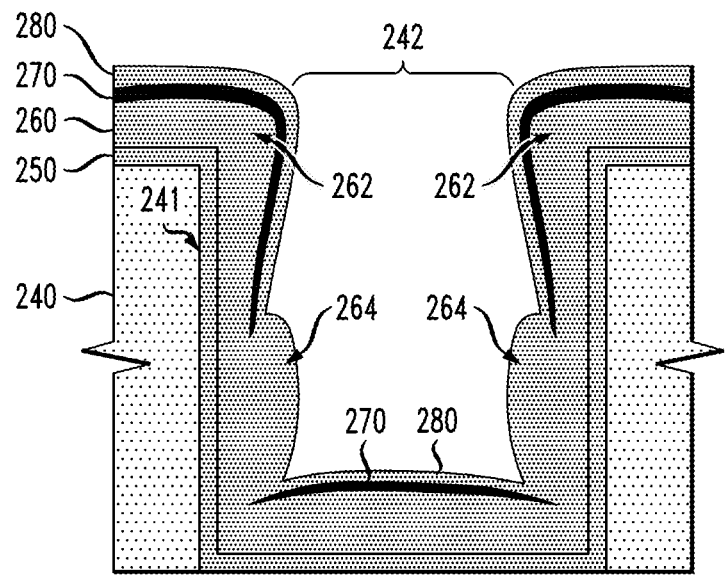
Figure 13:
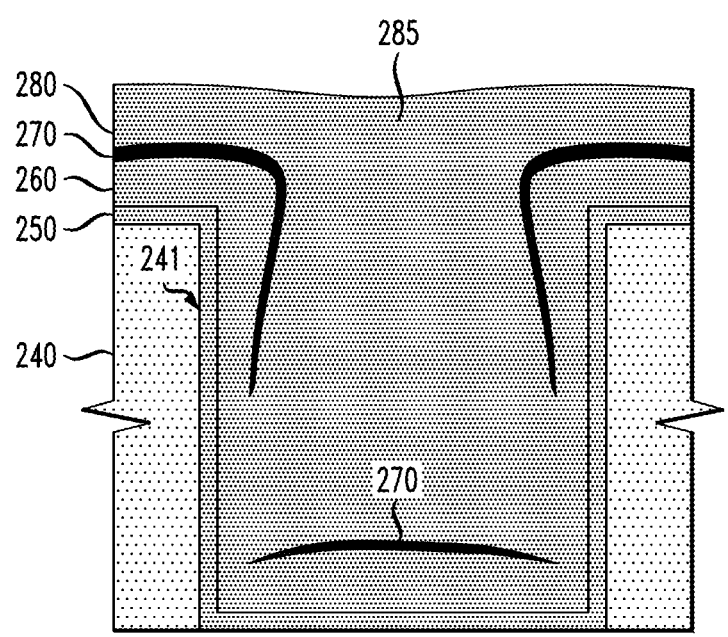

Next, FIG. 12 is a schematic cross-sectional side view of the semiconductor device of FIG. 11 after depositing a thin copper seed layer 280 to cover the metallic capping layer 270 and the initial electroplated copper material 264. The seed layer 280 serves as a cathode layer to perform a second electroplating process to fill the etched opening 241 with electroplated copper. For example, FIG. 13 is a schematic cross-sectional side view of the semiconductor device of FIG. 12 after performing a second electroplating process to deposit a layer of electroplated copper material 285 using the seed layer 280 as a plating cathode to fill the etched opening 241 with the electroplated copper material 285. In this process, pinch-off of an aperture 242 between the overhangs 262 prior to completion of the copper fill process is avoided as a result of the process in FIG. 12 of selectively depositing the copper material on the sidewalls of the opening 241, which effectively increases the thickness of the copper on the sidewalls to compensate for the thickness (protrusion) of the overhangs 262.

Figure 14:
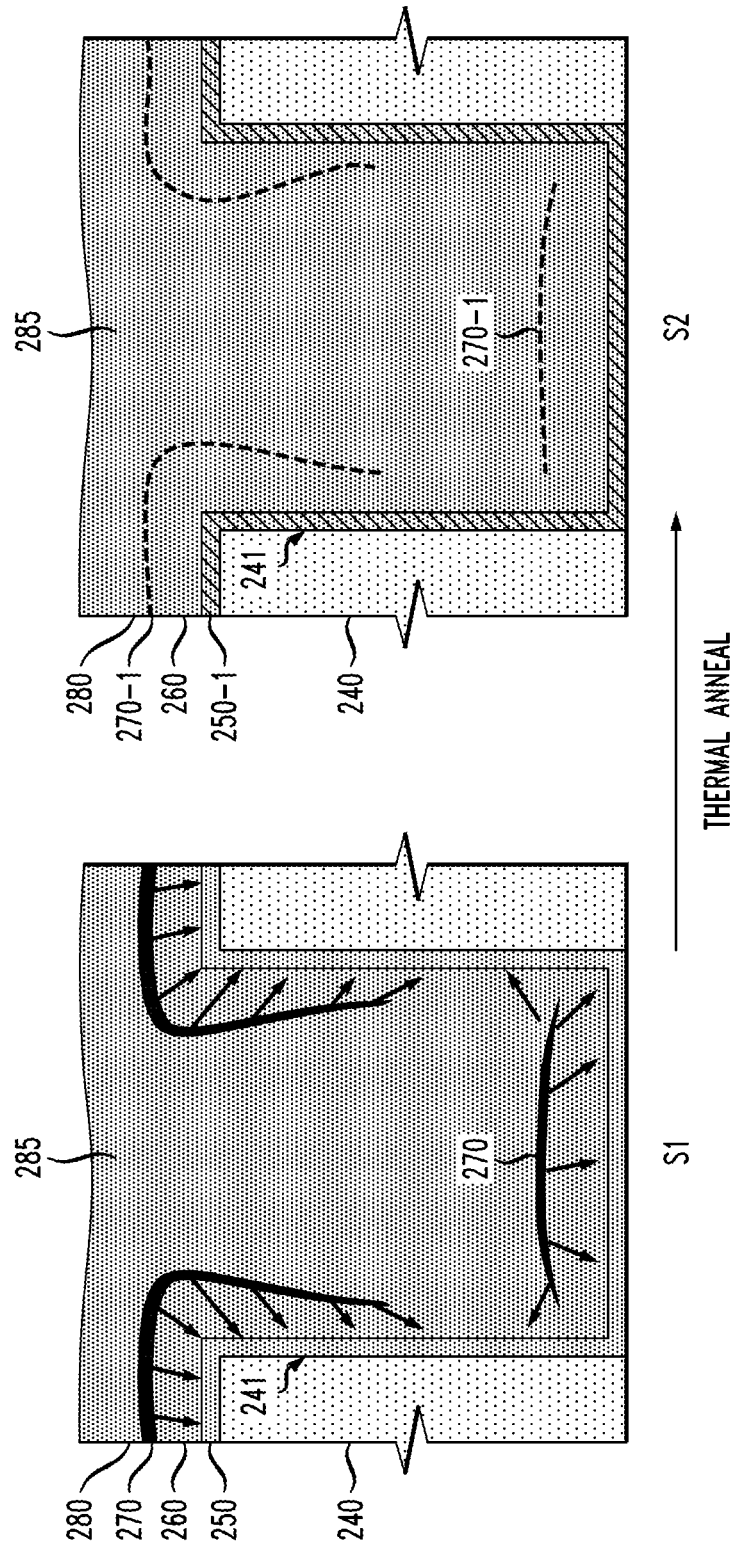

Next, FIG. 14 schematically illustrates a thermal anneal process for creating a self-formed diffusion barrier layer using the material of the metallic capping layer 270. In particular, FIG. 14 illustrates schematic cross-sectional side views of the semiconductor device of FIG. 13 at different stages S1 and S2 of a thermal anneal process which is performed to cause some or all the metallic material of the metallic capping layer 270 to diffuse through the electroplated copper material 285 and the seed layer 260 toward the liner layer 250 (as indicated by the arrows) and create a self-formed diffusion barrier layer 250-1. At a beginning stage S1 of the thermal anneal process shown in FIG. 14, the metallic atoms of the metallic capping layer 270 diffuse through the copper material towards the liner layer 250 on the sidewalls and bottom surface of the etched opening 241. In one embodiment, the thermal anneal process is performed in a furnace at a target temperature range and for a target period of time, which is sufficient to enable most or all the metallic atoms of the metallic capping layer 270 to diffuse towards the liner layer 250 and create the self-formed diffusion barrier layer 250-1, such that no residual amount of the metallic capping layer 270 remains in the copper material.

At an ending stage S2 of the thermal anneal process shown in FIG. 14, a residual portion 270-1 (shown as dashed lines) of the initial metallic capping layer 270 may remain, while the self-formed diffusion barrier layer 250-1 is created from the metallic material of the metallic capping layer 270. As in the embodiment discussed above, the self-formed diffusion barrier layer 250-1 comprises a combination of the original liner layer 250 and the additional metallic material diffused from the metallic capping layer 270, For example, in one embodiment, the additional metallic material diffused from the metallic capping layer 270 may self-form an additional thin barrier layer at the interface of the liner layer 250 and the copper seed layer 260, thereby effectively creating a new diffusion barrier layer 250-1 which is thicker than the original liner layer 250. In another embodiment, in instances where the original liner layer 250 is an extremely thin layer with discontinuities (e.g. voids), the additional metallic material diffused from the metallic capping layer 270 serves to fill in the voids in the original liner layer 250 and self-form a continuous and thicker barrier layer 250-1.

Figure 15:
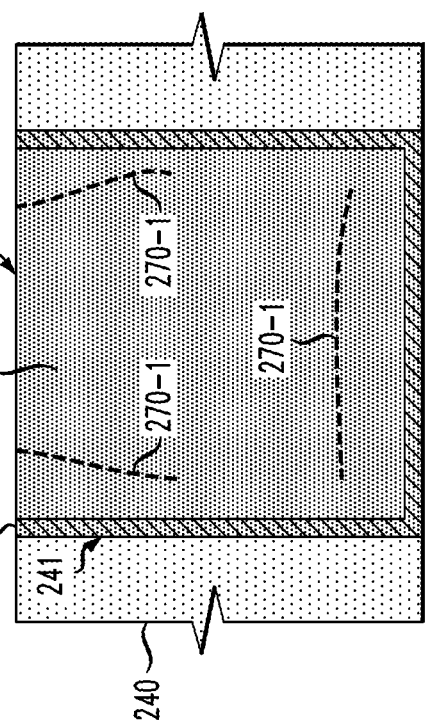

Following the thermal anneal process of FIG. 14, a CMP process is performed to planarize the surface of the semiconductor structure down to a target level to form a metallic interconnect stricture 290. For example, FIG. 15 is a schematic cross-sectional side view of the semiconductor device of FIG. 14 after performing a CMP process to planarize a surface of the semiconductor down to the dielectric layer 240. In particular, FIG. 15 schematically illustrates a result of the CMP process showing a planarized surface in which the overburden portions of the copper plating layer 285, the copper seed layers 280 and 260, the residual metallic capping layer 270-1, and self-formed barrier layer 250-1 have been etched away down to an upper surface of the dielectric layer 240.

The CMP process of FIG. 15 results in the formation of a metallic interconnect structure 290 which comprises the self-formed barrier layer 250-1, and copper material comprising remaining portions of the plated copper layers 285 and 264 and the seed layers 260 and 280. In addition, as shown in FIG. 15, a small amount of the residual metallic capping layers 270-1 remains within a top region and bottom region of the copper material 285. The metallic interconnect 290 can be a via interconnect structure, or a metallic wire (which extends in a direction orthogonal to the plane of the drawing). With this embodiment, the small portions of the residual metallic capping layers 270-1 which remain within the top and bottom regions of the copper material 285 can be left in place in instances wherein such small amount of the residual metallic capping layers 270-1 will not adversely affect performance of the metallic interconnect structure 290. On the other hand, in instances where the small amount of the residual metallic capping layers 270-1 may adversely affect performance of the metallic interconnect structure 290, the residual material of metallic capping layers 270-1 can be removed by performing an additional thermal anneal process.

Figure 16:
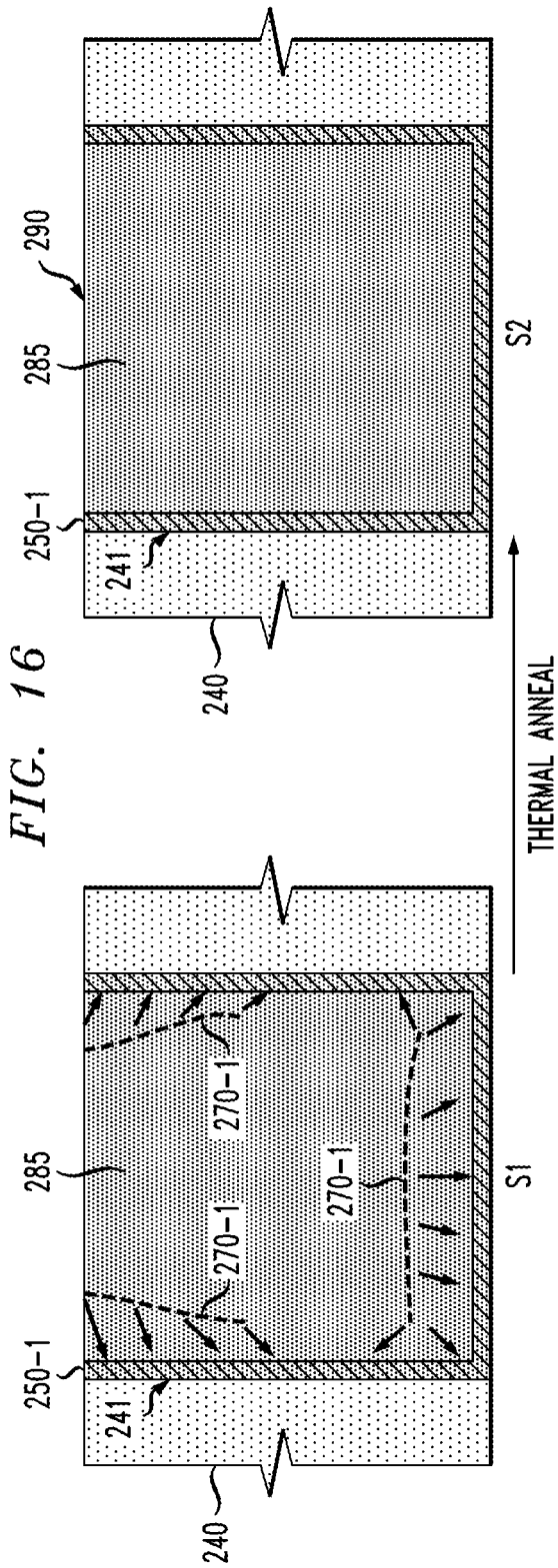

For example, FIG. 16 illustrates schematic cross-sectional side views of the semiconductor device at different stages S1 and S2 of a second thermal anneal process which is performed to remove the residual metallic capping layers 270-1 within the upper and lower regions of the metallic interconnect structure 290. At a beginning stage S1 of the second thermal anneal process shown in FIG. 16, the metallic atoms of the residual metallic capping layers 270-1 diffuse through the copper material towards the self-formed barrier layer 250-1 (as schematically illustrated by arrows). In one embodiment, the thermal anneal process is performed in a furnace at a target temperature range and for a target period of time, which is sufficient to enable all (or substantially all) of the metallic atoms of the residual metallic capping layers 270-1 to diffuse towards and combine with the self-formed barrier 250-1, which further enhances the thickness and functionality of the self-formed diffusion barrier layer 250-1. At an ending stage S2 of the second thermal anneal process shown in FIG. 16, the copper material 285 no longer includes the material of the residual metallic capping layers 270-1 within the upper and lower regions thereof.

It is to be understood that the methods discussed herein for fabricating void-free metallic interconnect structures (e.g., copper BEOL interconnect structures) with self-formed diffusion barrier layers can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method for fabricating a metallic interconnect of a semiconductor device, comprising:
    etching an opening in a dielectric layer;
    forming a liner layer on sidewall and bottom surfaces of the etched opening in the dielectric layer;
    forming a first seed layer over the liner layer;
    depositing a metallic material to selectively form a metallic capping layer on (i) an upper portion of the seed layer within a field region surrounding the etched opening, (ii) upper sidewall surfaces of the seed layer which define an aperture into the etched opening, and on (iii) a bottom surface of the seed layer within the etched opening;
    performing a first electroplating process to form a first plated metallic layer on exposed sidewall surfaces of the seed layer within the etched opening which are not covered by the metallic capping layer, wherein the metallic capping layer prohibits the first plated metallic layer from being formed on a surface of the metallic capping layer during the first electroplating process and decreasing a size of the aperture;
    forming a second seed layer over the metallic capping layer and the first plated metallic layer, subsequent to the first electroplating process;
    performing a second electroplating process to form a second plated metallic layer, wherein the second plated metallic layer is formed to fill the etched opening and form a metallic interconnect, wherein the second electroplating process commences by forming the second plated metallic layer on the second seed layer; and
    performing a thermal anneal process to cause at least some of the metallic material of the metallic capping layer to diffuse toward the liner layer and create a self-formed diffusion barrier layer.

2. The method of claim 1, wherein the metallic material of the metallic capping layer comprises at least one of tantalum, titanium, aluminum, manganese, and ruthenium.

3. The method of claim 1, wherein the first plated metallic layer comprises a copper material and wherein the metallic material of the metallic capping layer has a high copper-plating over-potential which prevents plating of the copper material on the metallic capping layer.

4. The method of claim 1, wherein the self-formed diffusion barrier layer comprises a thin layer of the diffused metallic material of the metallic capping layer, which self-forms at an interface between the liner layer and the seed layer during the thermal anneal process.

5. The method of claim 1, wherein the self-formed diffusion barrier layer is formed during the thermal anneal process by filling voids in the liner layer with the diffused metallic material of the metallic capping layer.

6. The method of claim 1, wherein the liner layer comprises one of tantalum, tantalum nitride, titanium, titanium nitride, cobalt and ruthenium.

7. The method of claim 1, further comprising, subsequent to performing the thermal anneal process, performing a chemical-mechanical polishing process to remove overburden material and form a planarized surface.

8. The method of claim 7, further comprising performing a second thermal anneal process to cause residual metallic material of the capping layer within the metallic interconnect to diffuse towards and combine with the self-formed diffusion barrier layer.

9. The method of claim 1, wherein the metallic capping layer is formed with a thickness of about 1 nm to about 5 nm.

10. The method of claim 1, wherein the dielectric layer comprises an interlayer dielectric layer of a back-end-of-line structure.

11. The method of claim 1, wherein the etched opening in the dielectric layer comprises a via opening, and wherein the metallic interconnect comprises a vertical via interconnect.

12. The method of claim 1, wherein the etched opening in the dielectric layer comprises a trench opening, and wherein the metallic interconnect comprises a wire interconnect.

13. A method for fabricating a metallic interconnect of a semiconductor device, comprising:
  etching an opening in a dielectric layer;
  forming a liner layer on sidewall and bottom surfaces of the etched opening in the dielectric layer;
  forming a first seed layer over the liner layer, wherein the seed layer comprises overhang structures formed on upper sidewall surfaces of the opening;
  selectively depositing a metallic material to selectively form a metallic capping layer that covers the overhang structures;
  performing a first electroplating process to form a first plated metallic layer on exposed sidewall surfaces of the seed layer within the etched opening which are not covered by the metallic capping layer, wherein the metallic capping layer prohibits the first plated metallic layer from being formed on a surface of the metallic capping layer during the first electroplating process;
  forming a second seed layer over the metallic capping layer and the first plated metallic layer, subsequent to the first electroplating process;
  performing a second electroplating process to form a second plated metallic layer, wherein the second plated metallic layer is formed to fill the etched opening and form a metallic interconnect, wherein the second electroplating process commences by forming the second plated metallic layer on the second seed layer; and
  performing a thermal anneal process to cause at least some of the metallic material of the metallic capping layer to diffuse toward the liner layer and create a self-formed diffusion barrier layer.

14. The method of claim 13, wherein the metallic material of the metallic capping layer comprises at least one of tantalum, titanium, aluminum, manganese, and ruthenium.

15. The method of claim 13, wherein the self-formed diffusion barrier layer comprises a thin layer of the diffused metallic material of the metallic capping layer, which self-forms at an interface between the liner layer and the seed layer during the thermal anneal process.

16. The method of claim 13, wherein the self-formed diffusion barrier layer is formed during the thermal anneal process by filling voids in the liner layer with the diffused metallic material of the metallic capping layer.

17. The method of claim 13, wherein the liner layer comprises one of tantalum, tantalum nitride, titanium, titanium nitride, cobalt and ruthenium.

18. The method of claim 13, further comprising, subsequent to performing the thermal anneal process:
  performing a chemical-mechanical polishing process to remove overburden material and form a planarized surface; and
  performing a second thermal anneal process to cause residual metallic capping layer material within the metallic interconnect to diffuse towards and combine with the self-formed diffusion barrier layer.

19. The method of claim 13, wherein the metallic capping layer is formed with a thickness of about 1 nm to about 5 nm.

20. The method of claim 13, wherein the dielectric layer comprises an interlayer dielectric layer of a back-end-of-line structure.

* * * * *